United States Patent [19]

Erlam

[11] Patent Number: 4,710,096

[45] Date of Patent: Dec. 1, 1987

[54] FAN MOUNTING

[75] Inventor: David P. Erlam, Winchester, England

[73] Assignee: Rittal-Werk Rudolf Loh GmbH & Co KG, Fed. Rep. of Germany

[21] Appl. No.: 818,776

[22] Filed: Jan. 14, 1986

[30] Foreign Application Priority Data

Jan. 23, 1985 [GB] United Kingdom ................ 8501657

[51] Int. Cl.<sup>4</sup> ............................................. F04B 17/00
[52] U.S. Cl. ............................ 415/121 G; 416/247 R; 98/94.1; 411/338; 415/219 R
[58] Field of Search .......... 415/121 G, 213 C, 219 R, 415/219 C; 98/94.1; 417/423 R; 416/247 R; 248/639, 672; 411/338, 339, 366, 427

[56] References Cited

U.S. PATENT DOCUMENTS

| | | | |
|---|---|---|---|
| 2,442,420 | 6/1948 | Lindvall | 415/219 C |
| 2,715,495 | 8/1955 | Sebastian | 98/94.1 X |
| 4,240,264 | 12/1980 | Nakada et al. | 417/423 R X |
| 4,568,243 | 2/1986 | Schubert et al. | 415/219 R X |
| 4,599,042 | 7/1986 | Colliver | 415/219 R |

FOREIGN PATENT DOCUMENTS

| | | | |
|---|---|---|---|
| 1107916 | 5/1961 | Fed. Rep. of Germany | 98/94.1 |
| 43573 | 11/1908 | Switzerland | 411/338 |
| 135671 | 12/1929 | Switzerland | 411/338 |
| 575561 | 2/1946 | United Kingdom | 416/247 R |

Primary Examiner—Robert E. Garrett
Assistant Examiner—Joseph M. Pitko
Attorney, Agent, or Firm—Renner, Otto, Boisselle & Lyon

[57] ABSTRACT

A fan casing for mounting a plurality of motor/fan units for cooling electronic apparatus mounted in racks or cabinets, the casing comprising two identical planar members to be assembled so that the motor/fan units are sandwiched between the planar members with finger guard members covering openings in the planar members. Inwardly directed projections formed by a pierce and plunge operation are provided on the planar members to engage in apertures in the motor/fan units to locate the motor/fan units and indentations are formed in the planar members to receive and locate the finger guard members so that when the two parts of the casing are assembled the finger guard members are disposed between the motor/fan units and the planar members. Attachment means are provided engaging in recesses to couple the two planar members one to the other, each planar member has parts of side walls and end walls integral therewith and the overall height 2D of the casing is 45 mm.

8 Claims, 9 Drawing Figures

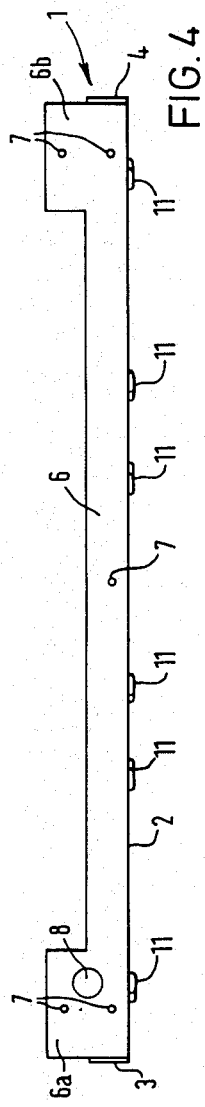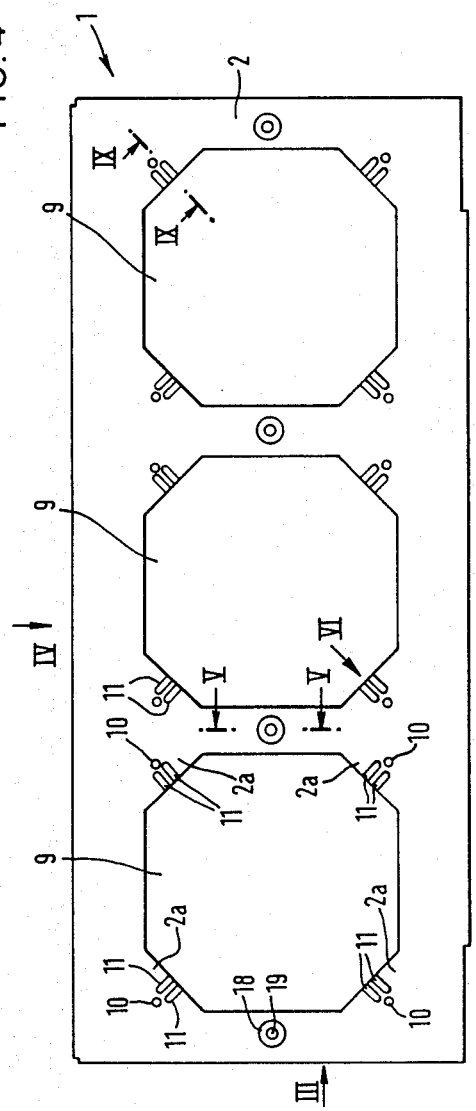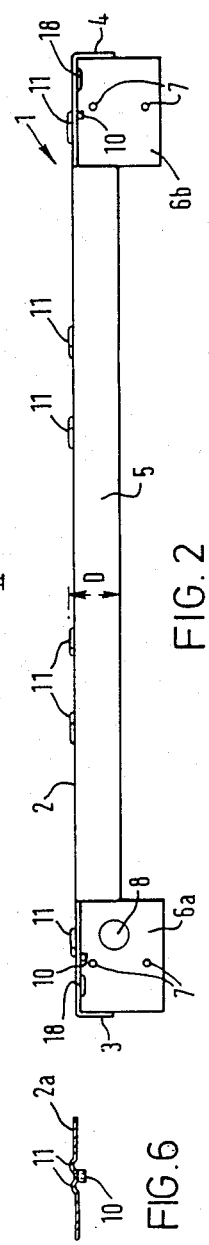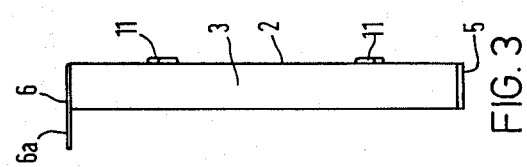

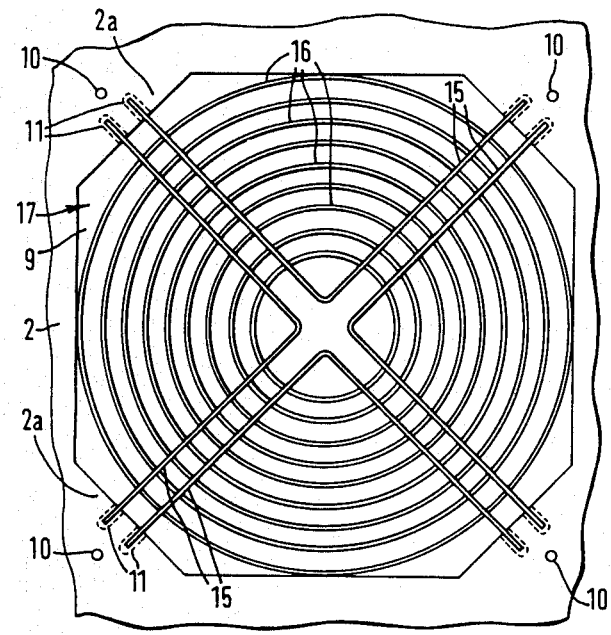
FIG. 7
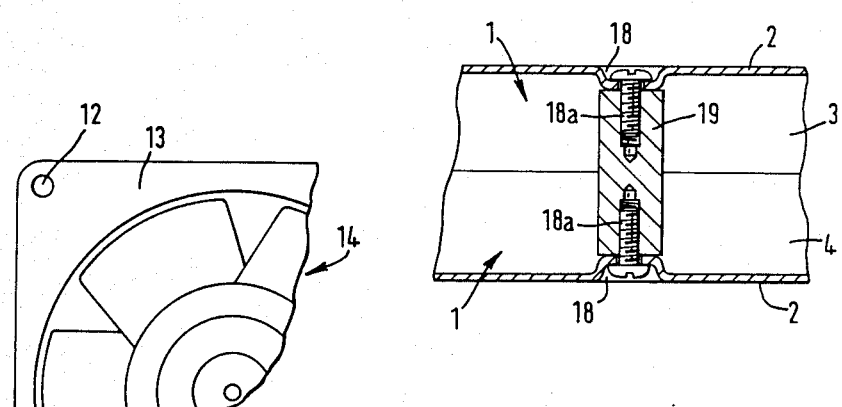
FIG. 5
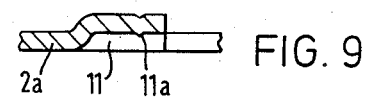
FIG. 8
FIG. 9

FAN MOUNTING

The invention relates to mounting of fans.

In electronic apparatus, particularly such apparatus mounted in racks or cabinets, fans are sometimes required to create an air flow to prevent the apparatus from overheating. Particularly air cooling is required of card frames and it is desirable that the fan or fans be provided in a casing which in "one unit" high, one unit in this context meaning 45 mm.

Fans previously used for this purpose have been axial flow motor/fan units which units are obtainable as propriety items. To assemble a plurality, for example three, of such units in a casing of one unit height by bolting the units to the casing, the casing having a lid and incorporating finger guards to screen the fan blades, is however a tedious assembly operation which considerably increases the cost of providing a three fan casing compared with the cost of the individual components.

According to the invention there is provided a fan casing for mounting a plurality of motor/fan units and comprising an upper planar member, a lower planar member, motor/fan units sandwiched between the planar members and finger guard members to cover openings in the planar members, characterised in that inwardly directed projections are provided on the planar members to engage in apertures in the motor/fan units to locate the motor/fan units, indentations are formed in the planar members to receive and locate the finger guard members so that when the casing is assembled the finger guard members are disposed between the motor/fan units and the planar members, the two planar members are substantially identical, and attachment means are provided to couple the two planar members one to the other.

Each planar member may have at least one side wall and one end wall thereon or a portion of a side wall and an end wall. Preferably each planar member has a half height end wall at each end, a half height side wall along one side with end portions thereof of full height and at the other side has a half height side wall with end portions thereof missing to form cut-aways to receive the full height side wall end portions of the other planar member when they are brought into engagement after one has been inverted.

The casing can be mounted in a rack or cabinet by means of a mounting strip with screw threaded studs thereon, the studs being engaged in apertures in one side wall of one of the planar members and secured by nuts, and the strip extending beyond the ends of the casing to enable it to be secured to corner members of the rack or cabinet.

Advantageously, the inwardly directed projections provided on the planar members to engage in apertures in the motor/fan units to locate the motor/fan units comprise inwardly directed portions of the material of which the planar member is formed, said material being caused to project inwardly by a pierce and plunge operation effected on the outer face of the respective planar member. The inwardly directed projections can thus relatively cheaply be formed and have the advantage that they are integral with the planar members and thus cannot become detached or lost.

The attachment means to couple the two planar members one to another preferably comprise elongate members with the opposite ends drilled and screw threaded to receive screws extending therein through apertures in the planar members from the outer face. If desired one of the planar members may be permanently secured to the attachment means, for example, by providing a rivet head on the elongate member rather than a screw threaded bore to receive a screw, such a planar member permanently attached to the attachment means comprising a base planar member. Preferably the base members are inwardly dished to form recesses to receive the screw heads or rivet heads such that the attachment means do not cause the fan casing to have a height greater than "one unit".

Since one of the upper planar members and one of the lower planar members with a set of the finger guards form a completely closed casing, electrical wiring within the casing to supply power to the motors of the motor/fan units can be merely trailed loosely within the casing rather than ducted and clamped since, due to the enclosure of the planar members, it is not vulnerable to snagging or abrasion.

Each of the indentations in the planar members preferably has a projection in the form of a transverse knife edge shaped portion of the material of the respective planar member extending thereinto to engage the finger guard member.

The invention is diagrammatically illustrated by way of example in the accompanying drawings, in which FIG. 1 is a plan view of an upper casing half of a fan casing according to the invention;

FIG. 2 is a view in the direction of arrow II of FIG. 1;

FIG. 3 is a view in the direction of arrow III of FIG. 1;

FIG. 4 is a view in the direction of arrow IV of FIG. 1;

FIG. 5 is a sectional view on line V—V of FIG. 1 and including attachment means for connecting the upper casing half to a lower casing half;

FIG. 6 is a view in the direction of VI of FIG. 1;

FIG. 7 is a plan view of a finger guard member lying in a lower casing half of a fan casing according to the invention;

FIG. 8 shows part of a motor/fan unit to be received within a fan casing according to the invention; and FIG. 9 is a fragmentary sectional view on line IX—IX of FIG. 1.

Referring to the drawings a fan casing is formed by two casing halves 1 each of which comprises a planar member 2 with end walls 3 and 4 and side walls 5 and 6. The two casing halves 1 are placed together to form a closed casing and the side wall 6 has end portions 6a and 6b of twice the height of the remaining portion of the side wall 6 and the side wall 5 has end portions thereof cut-away to receive the portions 6a and 6b of the other casing half 1. Five apertures 7 are provided in the side wall 6 and its end portion 6a and 6b to receive screw threaded studs projecting from a mounting strip (not shown) which, when in position, lies alongside the outer face of the side wall 6 with the studs projecting through the holes 7 and secured by nuts, the mounting strip being of greater length than the casing half 1 such that projecting end portions thereof can be used to secure the casing in a rack or cabinet. An additional aperture 8 is provided in the end portion 6a to provide passage for electrical cables.

The planar portion 2 of the casing half 1 has, in the embodiment shown three apertures 9 therein, each aperture 9 being generally square but having the corners filled in by portions 2a of the planar member 2. Each portion 2a has an inwardly directed projection 10 thereon and two outwardly directed projections 11. As can be seen in FIG. 6, each inwardly directed projection 10 comprises a generally cylindrical projection formed by a pierce and plunge operation by a tool acting on the outer face of the planar member 2 and is provided to engage in an aperture 12 of a housing 13 of a motor/fan unit 14 shown in FIG. 8. One of the apertures 12 is provided at each corner of each housing 13.

As also seen in FIG. 6, the projections 11 are formed as trough shaped recesses extending from the free edge of the portion 2a to receive end portions of generally radially directed wires 15 which are joined to circumferential wires 16 of finger guards 17 which cover the apertures 9 but enable air from the motor/fan units 14 to pass therethrough.

Recesses 18 are provided in the planar member 2 with apertures therein, FIG. 5, the recesses 18 receiving the heads of screws 18a which extend through the apertures into elongate members 19 which are screwthreaded at each end and which extend between the upper casing half 1 and the lower casing half 1 to secure them together.

The dimension D shown in FIG. 2 is half of one unit where one unit is 45 mm whereby, when the two casing halves are secured together, the overall height is one unit.

The fan casing may be formed to take more or less than the three fan units which the illustrated embodiment is designed to take.

Since the finger guards 17 are merely located by engaging the end portions of the wires 15 thereof in the trough shaped recesses 11 and the fan housings 13 are merely engaged and located with the casing half 1 by engaging the apertures 12 on the projections 10, the two component halves 1 of the fan casing, the fan units 14, the finger guards 17 and the attachment means for securing the two halves 1 of the fan casing together can be very rapidly assembled and disassembled with a very significant saving in time compared with previously used constructions.

In an assembly constructed as just described, the finger guards 17, when located by virtue of the end portions of the wires 15 being disposed in the recesses 11, are held in place merely by their being trapped between the fan units 14 and the planar members 2. While such an arrangement provides a perfectly sound construction from the point of view of mechanical integrity, it may in some circumstances be thought better from the point of view of electrical safety to provide some positive measure for ensuring earthing continuity between the finger guards 17 and the planar members 2 (which may be plated and painted, respectively), i.e. for ensuring good electrical contact between the finger guards 17 and the planar members 2 so that they are both at earth potential. As shown only in FIG. 9 each trough shaped recess 11 to receive an end portion of a radially directed wire 15 of a finger guard 17 may include a projection 11a, formed by a transverse knife edge shaped portion of the material of the planar members, extending into the trough shaped recess to make firm contact with the respective wire 15. Alternatively or in addition, the end portion of the wires 15 of the finger guards 17 may be spot welded to the planar members 2 within the recesses 11. While the welding operation involves an extra assembly step, the assembly and disassembly of the overall arrangement nonetheless can still be carried out quickly and easily.

What is claimed is:

1. A fan casing for mounting a plurality of motor/fan units and comprising an upper planar member, a lower planar member, motor/fan units sandwiched between said planar members and finger guard members to cover openings in the planar members, wherein inwardly directed projections are provided on the planar members to engage in apertures in the motor/fan units to locate the motor/fan units, indentations are formed in the planar members to receive and locate the finger guard members so that when the casing is assembled the finger guard members are disposed between the motor/fan units and the planar members, the two planar members are substantially identical, and attachment means are provided to couple the two planar members one to the other.

2. A fan casing as claimed in claim 1, wherein each of the planar members has at least one side wall and one end wall thereon.

3. A fan casing as claimed in claim 1, wherein each planar member has a half height end wall at each end, a half height side wall along one side with end portions thereof of full height and at the other side has a half height side wall with end portions thereof missing to form cut-aways to receive the full height side wall end portions of the other planar member when they are brought into engagement after one has been inverted.

4. A fan casing as claimed in claim 1, wherein the inwardly directed projections provided on the planar members to engage in the apertures in the motor/fan units to locate the motor/fan units comprise inwardly directed portions of the material of which the respective planar member is formed, said material being caused to project inwardly by a pierce and plunge operation effected on the outer face of the respective planar member.

5. A fan casing as claimed in claim 1, wherein the attachment means to couple the two planar members one to another comprise elongate members with the opposite ends drilled and screw threaded to receive screws extending therein through apertures in the planar members from the outer face.

6. A fan casing as claimed in claim 5, wherein the planar members are inwardly dished to form recesses to receive screw heads or rivet heads such that the attachment means do not cause the fan casing to have a height greater than "one unit".

7. A fan casing as claimed in claim 1, wherein the attachment means to couple the two planar members one to another comprise elongate members with one of the planar members permanently secured to the elongate members by providing a rivet head on one end of each elongate member and the other of the planar members can be coupled to the elongate members by providing a screw threaded bore in the other end of each elongate member to receive a screw.

8. A fan casing as claimed in claim 1, wherein each of the indentations in the planar members has a projection in the form of a transverse knife edge shaped portion of the material of the respective planar member extending thereinto to engage the finger guard member.

* * * * *